(12) United States Patent
Dyson et al.

(10) Patent No.: US 7,745,723 B2
(45) Date of Patent: Jun. 29, 2010

(54) CONCENTRATING TYPE SOLAR COLLECTION AND DAYLIGHTING SYSTEM WITHIN GLAZED BUILDING ENVELOPES

(75) Inventors: Anna H. Dyson, New York City, NY (US); Michael K. Jensen, Troy, NY (US); David N. Borton, Troy, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 760 days.

(21) Appl. No.: 11/294,482

(22) Filed: Dec. 6, 2005

(65) Prior Publication Data

US 2006/0132932 A1    Jun. 22, 2006

Related U.S. Application Data

(62) Division of application No. 10/816,933, filed on Apr. 5, 2004, now Pat. No. 7,190,531.

(60) Provisional application No. 60/475,002, filed on Jun. 3, 2003.

(51) Int. Cl.
*H02N 6/00*    (2006.01)

(52) U.S. Cl. .................. 136/246; 136/248; 136/259; 126/600; 126/621; 359/591; 359/593

(58) Field of Classification Search .................. 136/246, 136/248, 259; 126/600, 621; 359/591, 593
See application file for complete search history.

(56) References Cited

U.S. PATENT DOCUMENTS

| | | | |
|---|---|---|---|
| 4,326,012 A | 4/1982 | Charlton | |
| 4,373,308 A | 2/1983 | Whittaker | |
| 5,221,363 A * | 6/1993 | Gillard | ................. 136/248 |
| 5,851,309 A | 12/1998 | Kousa | |
| 6,020,554 A | 2/2000 | Kaminar et al. | |
| 6,037,535 A | 3/2000 | Yoshino | |
| 6,299,317 B1 | 10/2001 | Gorthala | |

(Continued)

FOREIGN PATENT DOCUMENTS

WO    WO 03/105240 A1    12/2003

OTHER PUBLICATIONS

Office Action dated Jan. 21, 2009, in counterpart Australian Application 2004248133, 3 pages.

(Continued)

*Primary Examiner*—Alexa D Neckel
*Assistant Examiner*—Xiuyu Tai
(74) *Attorney, Agent, or Firm*—Foley & Lardner LLP

(57) ABSTRACT

A Fresnel lens comprising a substantially polygonal focusing portion adapted to focus solar radiation to a area having the same geometry as the focusing portion of the lens. Also a solar module comprising the Fresnel collecting lens and a substantially polygonal photovoltaic cell. The photovoltaic cell is mounted at distance from the Fresnel collecting lens so that the size of the area substantially matches the size of the photovoltaic cell. Also a solar panel having multiple modules within a glazed building envelope system. The solar panel also includes an actuating mechanism within the glazed window envelope system. The actuating mechanism is operatively connected to the plurality of solar modules and is adapted to move the solar modules to track the sun.

24 Claims, 16 Drawing Sheets

U.S. PATENT DOCUMENTS

| | | | |
|---|---|---|---|
| 6,399,874 | B1 | 6/2002 | Olah |
| 6,700,055 | B2 | 3/2004 | Barone |
| 2001/0054252 | A1* | 12/2001 | Kleinwachter ............... 47/17 |

OTHER PUBLICATIONS

Wilson, Mike et al., "Sunlight, Optics and Liquid Optics: The UFO Project." Low Energy Architecture Research Unit, University of North London. 2000. URL: http://www.unl.ac.uk/LEARN/port/2000/ufo-pub/doc/epic_ufo.pdf.

Grise, William, and Charles Patrick. "Passive Solar Lighting Using Fiber Optics." *Journal of Industrial Technology.* 19:1, 2002. URL: http://www.nait.org/jit/Articles/grise122002.pdf.

"Passive Fiber-optic Daylighting Prototype Wins Award from NAHB and Popular Science." *Energy User News.* 2002. URL:http://www.energyusernews.com/CDA/ArticleInformation/nwes/news_item/0,2588,77722,00.html.

"Optical Fiber Illuminators." URL:http://www.unl.ac.uk/LEARN/port/1998/daymedia/web/marco/projects/ofi/ofi.html.

Sater, Bernard L. "High Intensity Silicon Vertical Multi-Junction Solar Cells, Prepared for the Department of Energy Inventions and Innovation Program." Final Report—DOE/GO10523. Jan. 31, 2003.

Green, M. *Solar Cells.*, Prentice-Hall, Inc. 1982.

"Photovoltaics—Energy for the New Milennium: The National Photovoltaics Program Plan for 2000-2004." National Center for Photovoltaics. URL:http://www.nrel.gov/ncpv/pvmenu.cgi?site=ncpv&idx-3&body=infores.html.

"U.S. Photovoltaic Roadmap." Prepared by Energetics, Inc., May 2001. URL:http://www.nrel.gov/ncpv pvmenu.cgi?site=ncpv&idx-3&body=pvplans.html.

"Transparenter Sonnenschutz mit Holograpisch Opteishen Elementen (HOE) und Photovoltaik (PV)." Institut fur Licht-und Bautechnik an der Fachhochschule Koln. 1999. URL:http://www.aq-solar.de/projekte/berichte/25314197.pdf.

"Bringing air and light to the working environment." *Research Focus: Promoting the Application of Research in Building and Civil Engineering.* Issue 35, Nov. 1998. URL:http://ice.org.uk/rtfpdf/rfnov98.pdf.

Fanney A. Hunter, et al "Performance and Characterization of Building Integrated Photovoltaic Panels." National Institute of Standards and Technology. Reprinted from proceedings of $29^{th}$ IEEE Photovoltaic Specialists Conference, 2002. URL:http://bfrl.nist.gov/863/bipv/documents/ieeeFNL.pdf.

Recent Progress in the Development of III-V Solar and Thermophotovoltaic Cells, F. Dimroth, et al., Compound Semiconductor 6(6) Aug. 2000, pp. 1-4.

Kookaburra: Solar Window Shades Feb. 9, 2003 *Wired News* by Anna Dyson; http://kookaburra.typepad.com/weblog/2003/09/solar_window_sh...Accessed Jan. 9, 2004.

Solar Cell Manufacturers Come Back Down to Earth, Optics.org., p. 1-6 plus figures; http://optics.org/articles/feature/8/12/1/1 Accessed Jan. 12, 2004.

The Technology to Explore, Rensselaer Magazine, Fall 2003; New Dimensions in Architecture, p. 1-4, http://www.rpi.edu/dept/NewsComm/Magazine/fall03/feature1-3. Accessed Jan. 9, 2004.

Taking a Load Off the National Power Grid, Press Release, Aug. 21, 2003, p. 1-2, http://www.rpi.edu/web/News/press_releases/2003/grid.html Accessed Jan. 9, 2004.

Taking a Load Off the National Power Grid, New solar-powered Window System Heats, Cools, Lights and Shades Commercial Buildings, ScienceDaily News Release, p. 1-4, http://www.scidencedaily.com/releases/2003/08/030826065552 Accessed Jan. 9, 2004.

Abstract JP 06 174249A, Komatsu Ltd. Jun. 24, 1994.

Abstract JP 04 280482A, Oki Electric Ind. Co. Ltd., Oct. 6, 1992.

Abstract JP 2002 081274A, Mitsubishi Estate Co., Ltd., Mar. 22, 2002.

Abstract, JP 60 260166A, Fuji et al., Dec. 23, 1985.

* cited by examiner

FIG. 9A EARLY MORNING
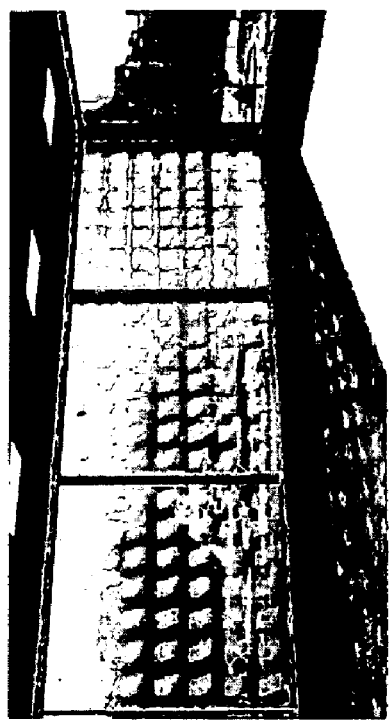
FIG. 9B NOON
FIG. 9C MID AFTERNOON
FIG. 9D LATE AFTERNOON

US 7,745,723 B2

CONCENTRATING TYPE SOLAR COLLECTION AND DAYLIGHTING SYSTEM WITHIN GLAZED BUILDING ENVELOPES

This application is a divisional application of U.S. patent application Ser. No. 10/816,933, filed on Apr. 5, 2004, U.S. Pat. No. 7,190,531 issued on Mar. 13, 2007, which claims priority to U.S. Provisional Application No. 60/475,002, filed on Jun. 3, 2003, which are both hereby incorporated by reference in their entirety.

FIELD OF THE INVENTION

The present invention is directed generally to the generation of solar power and specifically to a multi-function system for the generation of power using concentrating solar collection.

BACKGROUND OF THE INVENTION

Conventional technologies used for the generation of solar power include (1) building-integrated 'flat-plate' photovoltaic (PV) solar systems and (2) 'stand-alone' concentrating PV systems that are removed from the location of power application. Although these technologies work, widespread adoption of these solar powered systems for general use has been hampered by a number of impediments.

The viability of the flat plate technology is hindered by the large amount of silicon required in the manufacture of the system. A typical flat panel system is illustrated in FIG. 1. The roof of the building is covered with large solar panels 14, each of which contain a large number of photovoltaic cells 41. This results in a very expensive system. Within the current market structure, these systems are both dependent on scrap discards from the semiconductor industry, as well as on large government subsidies for their implementation—both circumstances constitute economic impediments for a growing industry. Furthermore, even with substantial subsidies, large flat-plate silicon PV panels have been difficult to market because they have been perceived by consumers as unsightly and/or inappropriate for most building types. Reducing the large silicon content would allow for the implementation of more architecturally viable materials.

The viability of the 'stand-alone' concentrating PV systems has been hindered by the cost and the appearance of the large tracking structures 2 (see FIG. 2) required for their implementation. This not only increases the cost payback period, it excludes them from application to sites which would most benefit from their energy production. That is, the enormous and unsightly appearance of the structures substantially limits their potential for widespread application to building properties. Furthermore, the stand alone concentrating PV systems suffer from wind loading effects due to their large size.

Additionally, both of the conventional systems suffer from relatively weak 'solar to electric' operating conversion efficiencies. The best operating efficiencies demonstrated by either flat plate or concentrating solar systems currently on the market are in the order of 12.5%-20% electric conversion of incoming solar energy. Furthermore, the remaining 80%-87.5% energy is generally lost as wasted heat. Therefore, it would be advantageous to have a new systems which not only had a higher solar to electric conversion, but also converts a majority of the remaining heat energy towards direct applications.

SUMMARY OF THE INVENTION

A first embodiment of the invention includes a Fresnel lens comprising a substantially polygonal focusing portion adapted to focus solar radiation to a polygonal area.

Another embodiment of the invention includes a Fresnel lens comprising a substantially polygonal focusing portion adapted to focus solar radiation to a polygonal area, and a back support structure adapted to support a photovoltaic cell at a predetermined distance from the Fresnel lens such that solar radiation is focused onto the photovoltaic cell. The back support structure has first portion connected to the Fresnel lens and a second portion adapted to support the photovoltaic cell. The first portion of the back support structure has a first cross sectional area and a second portion of the back support structure has a second cross sectional area smaller than the first area.

BRIEF DESCRIPTION OF THE DRAWINGS

The foregoing and other features, aspects and advantages of the present invention will become apparent from the following description, appended claims and the exemplary embodiments shown in the drawings, which are briefly described below.

FIG. 9 is a simulation illustrating the orientation and view through an embodiment of the invention at (A) early morning, (B) noon, (C) mid afternoon, and (D) late afternoon.

DETAILED DESCRIPTION OF THE PREFERRED EMBODIMENTS

Figure 2:
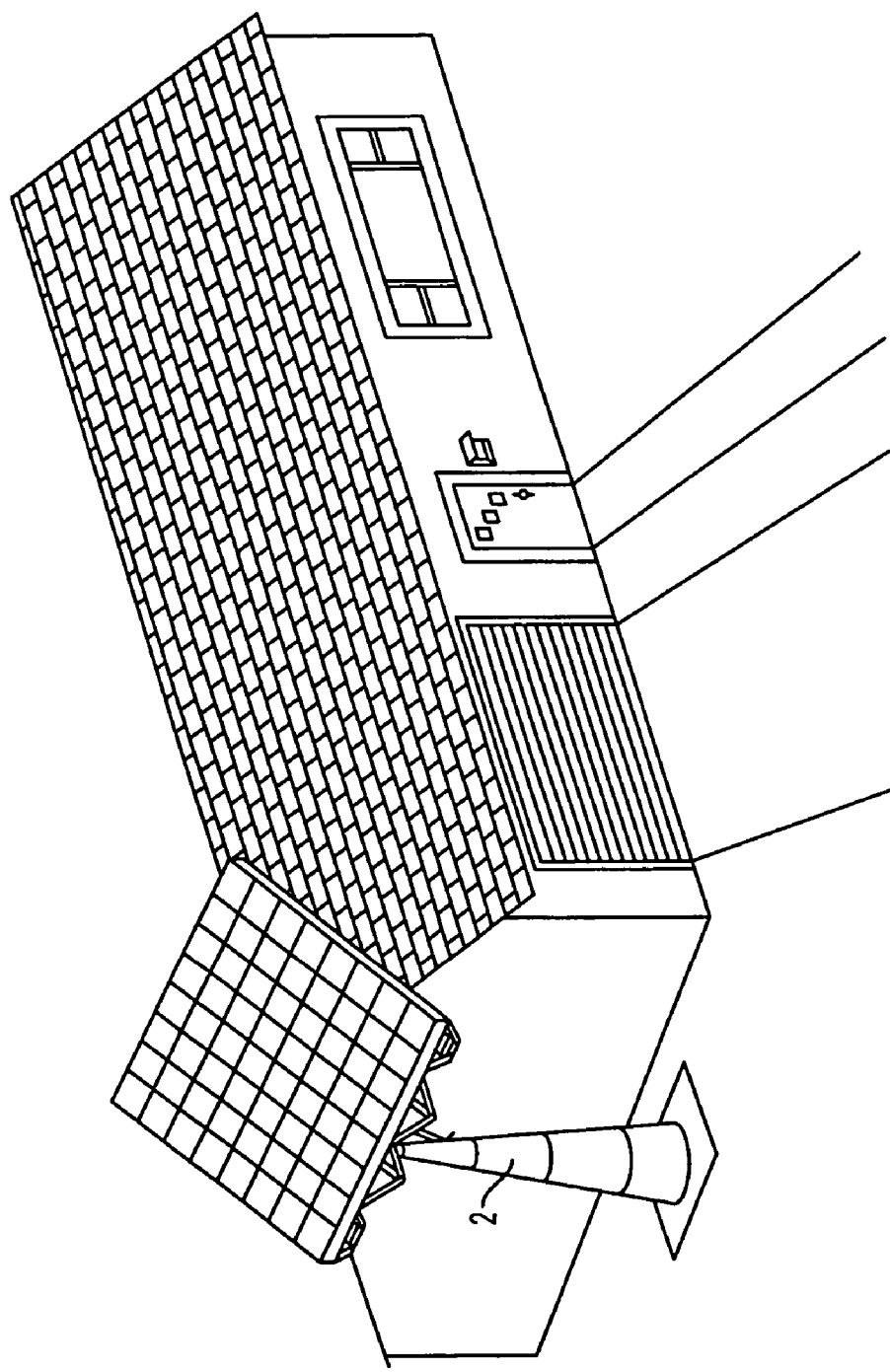
FIG. 2 is schematic view of a prior art stand alone photovoltaic solar system.

The present inventors have discovered that by taking a different approach to the flat plate and stand alone technologies, a superior solar power generation system could be achieved. While the 'flat plate' PV system is relatively expensive and inefficient to overcome the impediment of long cost pay-back periods, a system of the preferred embodiments of the present invention focuses on integrating concentrator PV technology into existing structural and environmental systems of buildings, thereby removing the need for large, costly tracking devices. The system of the preferred embodiments of the present invention contains a plurality of miniaturized solar modules, each of which contains a photovoltaic (i.e., solar) cell and a focusing device, such as a lens. The term miniaturized means that the modules are at least an order of magnitude smaller than the stand alone PV concentrator system shown in FIG. 2. The modules are integrated and distributed in a building envelope, preferably in a facade of a building envelope. An actuating mechanism is operatively connected to the plurality of modules to move the modules in at least two dimensions to track the sun. By integrating and distributing the modules inside the building envelope facade, several advantages may be obtained compared to the stand alone PV system of FIG. 2. First, the miniaturized modules do not require the large and unsightly stand alone PV tracking structure of FIG. 2. Second, by locating and distributing the modules in a building facade provides a power generating system with a large area covered by the PV concentrator modules, since a building facade has a large surface area, especially a facade of a multistory building. The area covered by the PV concentrator modules is preferably much greater than an area covered by the stand alone PV system of FIG. 2. Thus, the power generation system can provide a larger power output due to the increased area covered by the PV concentrator modules. Third, integrating the modules inside the building envelope, such as between window panes in a building facade, protects the modules from the adverse effects of wind loading. Fourth, distributing the modules between window panes provides pleasing, diffuse light into the building interior. Of course, if desired, the modules may also be located on the roof of a building in addition to or instead of in a building facade.

Concentrator PV systems of the preferred embodiments have two primary provisions for good operating efficiency. First, they should face in the direction of incoming solar rays during operation, calling for two-axis tracking. Second, they should have a high degree of accuracy in the tracking motion, therefore calling for protection from weather and resistance against live loads. They also should have large surface areas 'collecting' direct sunlight, which should then be focused into many small points to capture the light energy for electricity and the heat energy for other applications.

By miniaturizing and distributing the components of concentrating PV technology, and preferably locating them within building envelopes, the proposed system seamlessly integrates concentrating PV technology into the shading systems of existing buildings. This miniaturization renders the technology almost invisible, while also allowing it to further reduce energy consumption of the building, thereby compounding the cost savings for the user. The system produces electricity with a concentrating photovoltaic (PV) cell and preferably utilizes the remaining solar energy as heat for domestic hot water, space heating, or distributed absorption cooling. Additionally, in cases with very large building surface areas, the system could be used to drive a conventionally centralized absorption refrigeration cooling system.

The system may also compound energy savings by reducing solar gain by the building. Optionally, direct current transfer to power high-efficiency DC LED (Light Emitting Diode) lighting may be employed while also enhancing interior daylighting quality. Thus, overuse of artificial lighting may be reduced.

In a preferred embodiment of the invention, a building integrated photovoltaic system substantially reduces the energy consumption profile of commercial buildings (particularly during peak loads) by combining functions normally implemented separately. The system combines functions including electricity generation, thermal energy production, improved daylighting and reduced solar gain. Preferably, these functions are integrated from the inception of the design process and optimized for seasonable performance while addressing the architectural aspects of the design. In one aspect of the invention, the modular design can be attached to a range of existing building structures or implemented into new designs. Further, as a distributed system, it can capitalize on existing structures as support, and provide protection for a system thereby reducing cost for an expensive tracking structure and encasement.

Figure 1:
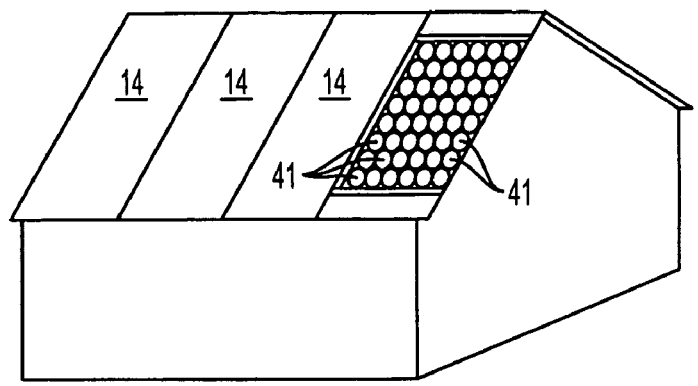
FIG. 1 is schematic view of a prior art plate photovoltaic solar system.
Figure 3A:
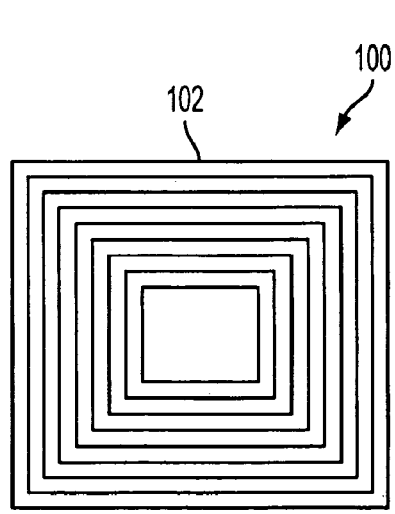
FIG. 3A is a schematic illustration of a Fresnel lens according to one embodiment of the invention.

FIG. 3A illustrates a Fresnel lens 100 according to one embodiment of the invention. The Fresnel lens 100 of this embodiment has a substantially polygonal focusing portion 102 adapted to focus incident solar radiation to a polygonal area. Preferably but not necessarily, the focusing portion 102 has the same geometry as the lens. However, the focusing portion 102 may have a different geometry from the lens. Preferably, the polygonal focusing portion is substantially square or rectangular (i.e., substantially square or rectangular when viewed from the focusing surface). The term "substantially" allows deviation from the described shape without losing the appearance of the described shape. For example, a substantially polygonal shape is a non-random and non-circular shape that is exactly polygonal or appears polygonal but having sides having minor deviation from straight line shape. This contrasts with most prior art Fresnel lenses which typically have a circular geometry and are configured to focus to a round area. Because of their round geometry, the prior art lenses are either (1) coupled with round solar cells, which have lower availability and are more expensive than square solar cells or (2) coupled with square solar cells, resulting in an uneven distribution of solar radiation across the radiation receiving surface of the solar cell and lower electrical conversion efficiency.

Figure 4A:
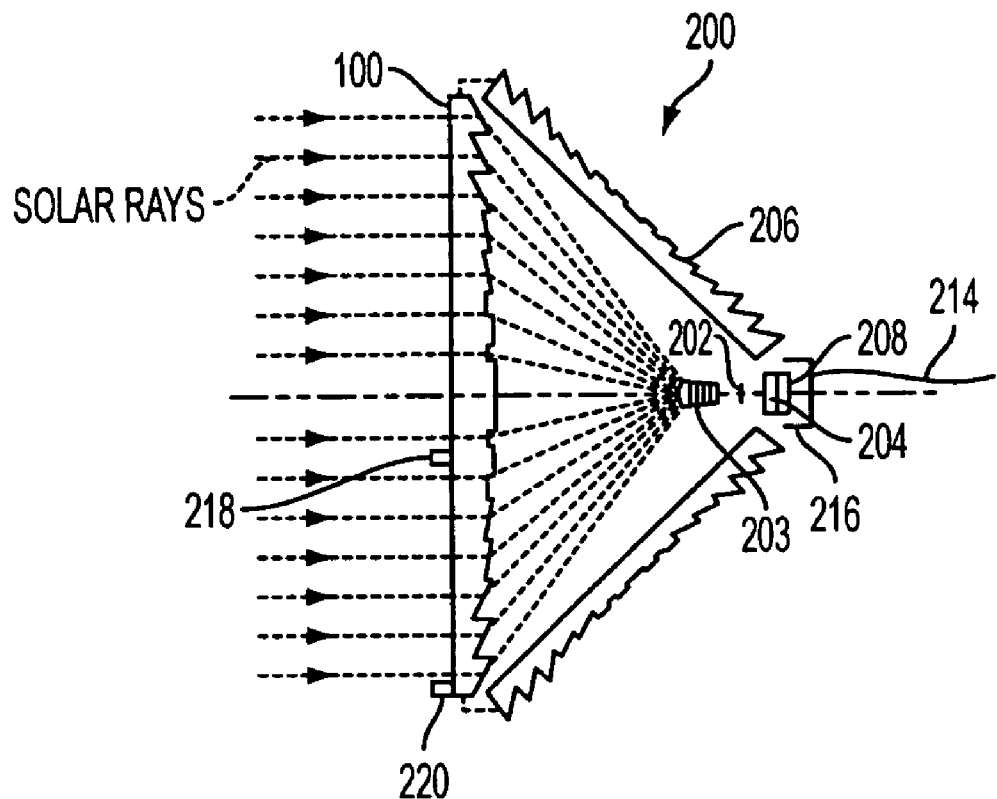
FIG. 4A is a schematic side cross sectional view of a solar module according to one embodiment of the invention.

FIG. 4A illustrates another embodiment of the invention. This embodiment is a solar module 200 which preferably incorporates the Fresnel lens 100 of the previous embodiment. The solar module 200 of this embodiment also includes a photovoltaic cell 202 (i.e., solar cell) which preferably, but not necessarily, has substantially the same geometry as the Fresnel lens 100. In other words, the radiation receiving surface of the cell 202 preferably has substantially the same geometry as that of the lens 100. However, other collecting lenses besides Fresnel lenses may be used if desired. Further, the photovoltaic cell 202 is mounted at a distance from the Fresnel lens 100 so that the size of the area of solar radiation focused from the Fresnel lens 100 is substantially the same size as the photovoltaic cell 202. The terms "substantially" mean exactly the same or deviating by 10% or less, preferably by 5% of less. Thus, the solar radiation from the Fresnel lens 100 is substantially uniformly focused across the radiation receiving surface of the photovoltaic cell 202. Further, because the focused solar radiation area size and the photovoltaic cell 202 radiation receiving surface size are the same, essentially all of the incident solar radiation of the Fresnel lens 100 is focused on the radiation receiving surface photovoltaic cell 202.

In a preferred aspect of the present embodiment, the photovoltaic cell 202 is a vertical multi-junction (VMJ) cell designed for use with concentrating solar collectors. Vertical multi-junction cells produce voltages much higher than typical flat plate solar cells and have a higher solar energy to electricity conversion efficiency, in the order of 15-50% for sun concentrations of 250-1000 or more. Alternatively, other types of photovoltaic cells may be used, such as III-V (i.e., GaAs, GaInAs, GaInP or other III-V based solar cells), silicon p-n junction solar cells and Swanson-type back-point contact solar cells. Optionally, solar module 200 may include a focusing lens 203 to aid in focusing the light onto the photovoltaic cell 202 as well as to provide a more uniform flux on the cell 202. In this case, the area of solar radiation focused by the Fresnel lens preferably is about the same as that of the focusing lens 203 and the area of solar radiation focused by the focusing lens 203 is preferably about the same as the radiation receiving surface of the photovoltaic cell 202.

Further, the solar module 200 preferably also includes a heat sink 204 and a back support structure 206. The heat sink 204 is affixed to the back support structure 206. The photovoltaic cell 202 is mounted on the heat sink 204 or on the back support structure 206 or on both. Thus, the back support structure either directly or indirectly supports both the Fresnel lens 100 and the photovoltaic cell 202. The Fresnel lens 100 is preferably a plastic injection molded lens which is interlocked or snap fitted onto the back support structure 206. The term interlocked means that the lens 100 is permanently or removably attached to the structure 206 by a interlocking mechanism, such as a hooking or dovetailing mechanism. Examples of such mechanism are hooks, clasps and dovetails. The term snap fitted means that the lens 100 is permanently or removably attached to the structure 206 by pressing the lens 100 and the structure 206 against each other. The lens 100 may be held in the structure 206 by force of friction and/or by protrusions on one of the lens 100 and the structure 206 which snap into depressions or holes in the other one of the lens 100 and the structure 206. The snap fit or interlocking attachment of the lens and the structure is advantageous because it decreases the assembly cost and time.

The back support structure 206 may have any suitable shape. Preferably, the structure 206 has a larger cross sectional area at the front portion adapted to be connected to the Fresnel lens 100 and a smaller cross sectional area at a back portion adapted to support the photovoltaic cell 202. Preferably, the structure 206 has a substantially pyramidal or conical shape. In other words, the shape is either exactly pyramidal or conical or appears pyramidal or conical, but with a small amount deviation from the pyramidal or conical shape. This includes truncated pyramidal and conical shapes as well as shapes having sidewalls that deviate from exact straight lines. The lens 100 comprises the base of the pyramid or cone. The sidewall or sidewalls of the structure 206 are preferably made of either a translucent material, a diffusing material or a Fresnel diverging material surface. The diffusing material may be an optical diffusing material, where a surface of the material is microstructured to diffuse light or the diffusing material may be a material which diffuses light due to the bulk properties and composition of the material. Preferably, the sidewall(s) of the back support structure are made of a diffusing material which is shaped to block the focused solar radiation from being visible from a back side of the back support structure 206. The back side of the back support structure is the side that faces away from the Fresnel lens 100. Thus, in this embodiment, the sidewall(s) of the support structure 206 provides protection for eyes of the observers, who may be located behind the back support structure, from directly observing the focused solar radiation and sustaining an eye injury.

Preferably, one or more air gaps exist between the lens 100 and the back support structure 206 to allow the hot air in the module 200 to be vented out of the module. Preferably, the air gap(s) are slit shaped air gaps located along the edges of the lens 100.

Figure 4B:
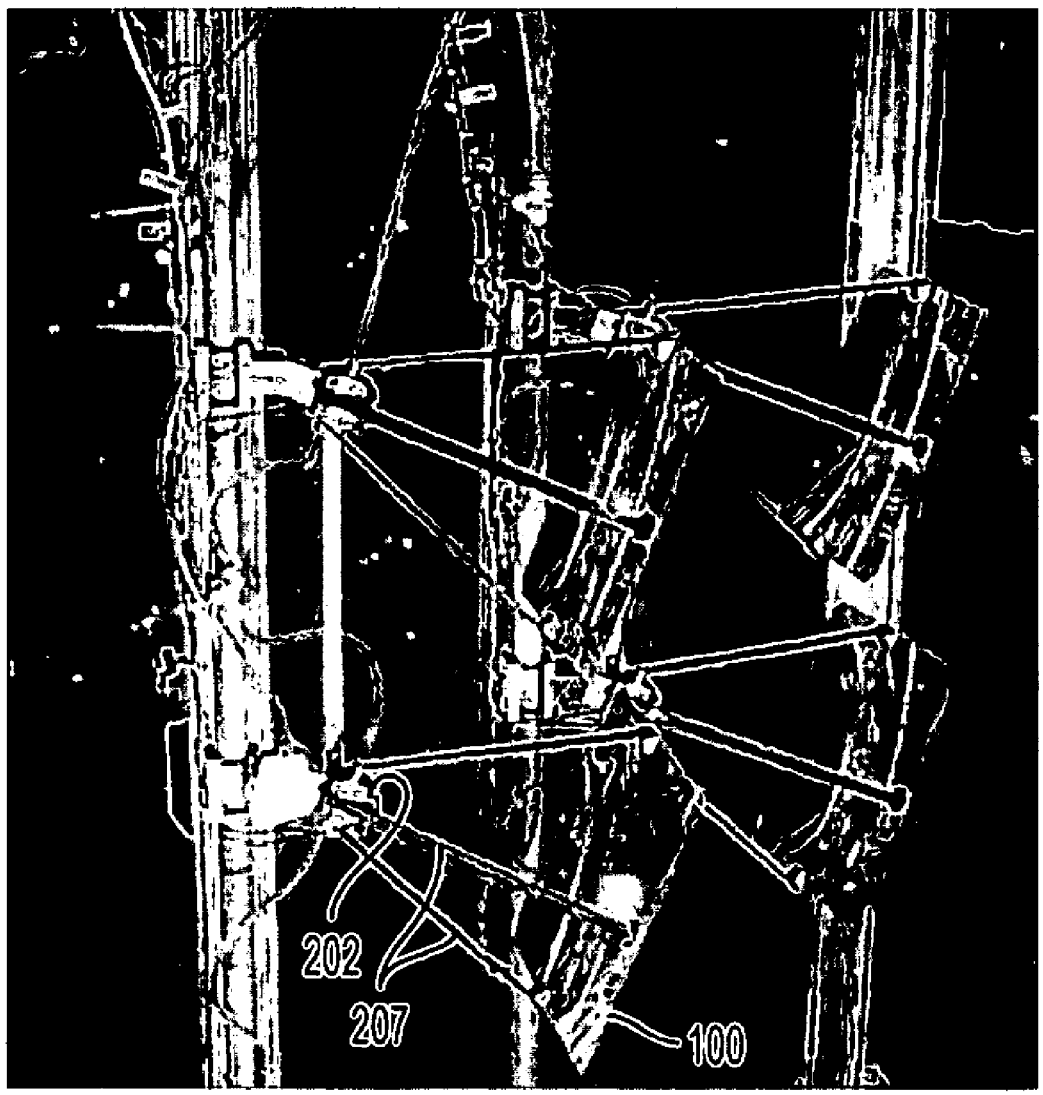
FIG. 4B is a photograph of an array of solar modules according to another embodiment of the invention.

In another embodiment of the invention, the back support structure 206 comprises an arrangement of wires or rods 207 that are adapted to be interlocked or snap fitted onto the Fresnel lens 100, as shown in FIG. 4B. Preferably, the arrangement of wires or rods is substantially pyramidal or a substantially conical in shape. The back support structure 206 contains connecting members, such as hooks, ledges, snap fit protrusions or dovetails which are adapted to support the photovoltaic cell 202 in the structure 206. If the structure 206 is provided in a location, such as in a window, where the focused solar radiation may be incident on an eye of the observer, then shielding panels, such as panels made of a translucent material, a diffusing material or a Fresnel diverging material may be attached to the wires or rods 207 to form sidewalls of the structure. However, if the structure 206 is mounted on a roof of a building or in other locations where the focused solar radiation would not be incident on an eye of the observer, then the shielding panels may be omitted to simplify the structure.

Figure 5:
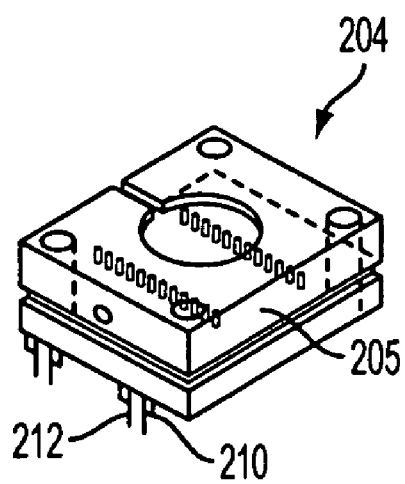
FIG. 5 is a perspective view of a heat sink used in the solar module.

Preferably, the heat sink 204 is also interlocked or snap fitted to structure 206. Any suitable type of heat sink 204 may be used in the module 200. Preferably, a radiative type heat sink, a cooling fluid type heat sink, a passive cooling type heat sink and/or a heat-pipe type heat sink is used. A cooling fluid type heat sink 204 shown in FIG. 4A contains a cooling scheme to extract heat from the heat sink. One such cooling scheme includes cooling channels 205, shown in FIG. 5 which are designed to carry a coolant (i.e., a cooling fluid). Typically, water is used as a coolant. However, any commercial coolant, such as ethylene glycol, may be used.

If desired, the photovoltaic cell 202 may be omitted from the module 200 such that the focused solar radiation is incident directly onto the heat sink 204. Thus, the focused solar radiation is converted to heat by the heat sink 204, and the heat is then transferred to the building or other structure incorporating the module 200. This type of module 200 may be used for heating of a building rather than for electricity generation.

Figure 6A:
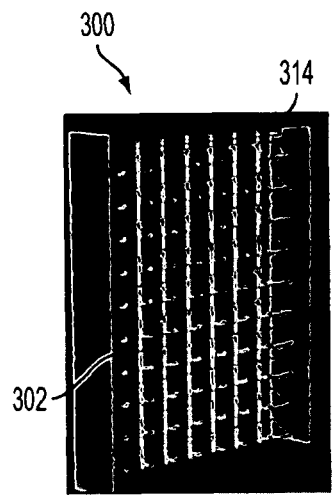
FIG. 6A is a perspective view of a solar panel according to one embodiment of the invention.
Figure 6B:
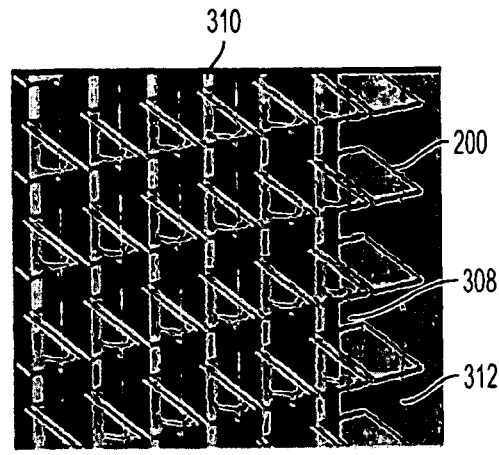
FIG. 6B is a close up of the solar panel illustrated in FIG. 6A.
Figure 6C:
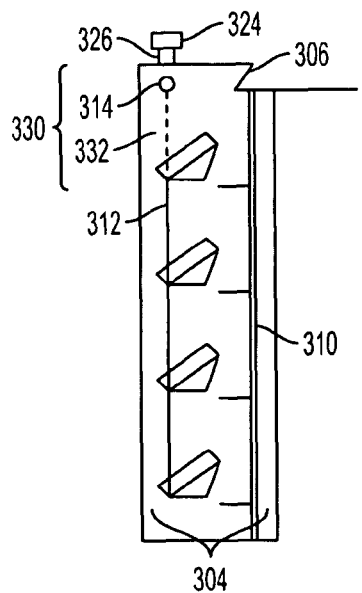
FIG. 6C is a schematic illustration of the solar panel illustrated in FIG. 6A.
Figure 6D:
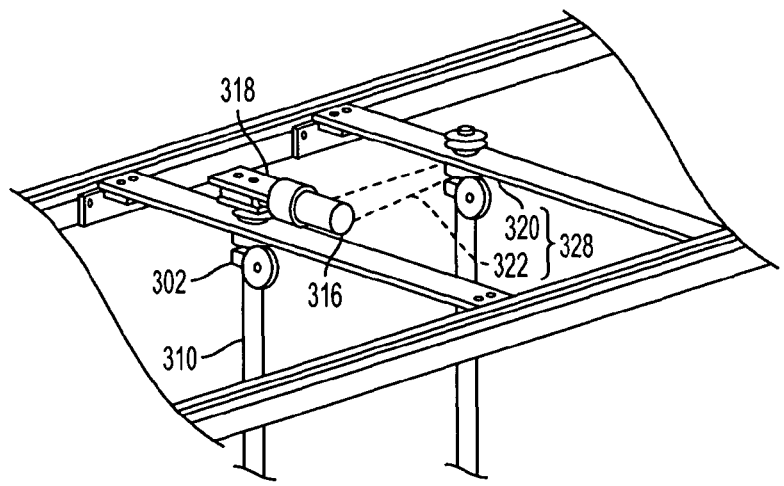
FIG. 6D close up of actuating system of the solar panel illustrated in FIG. 6A.
Figure 8:
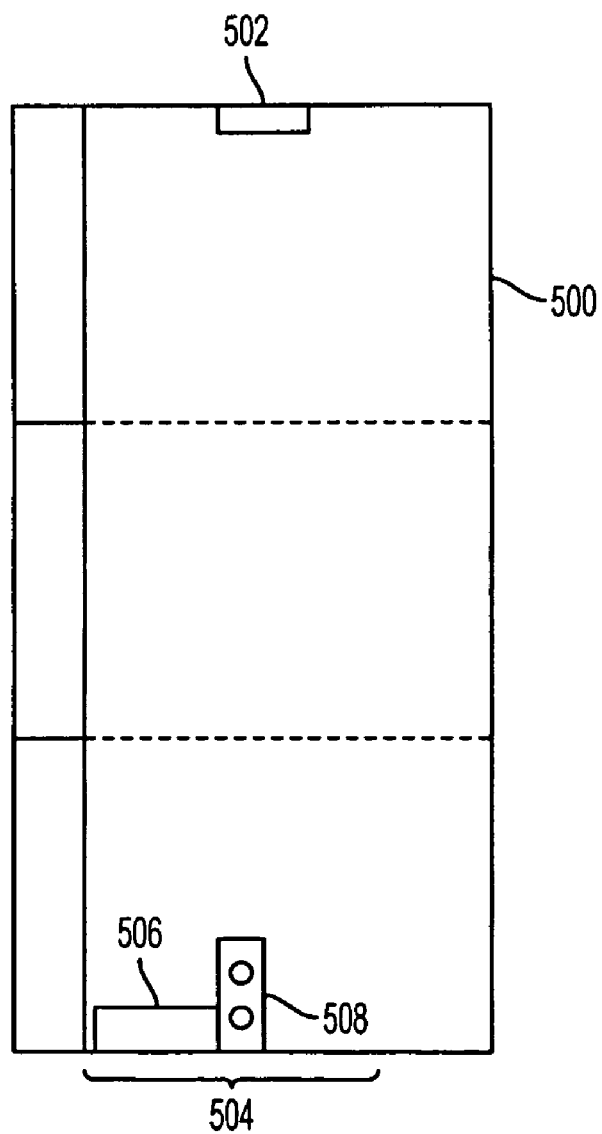
FIG. 8 is a schematic illustration of a solar energy system according to an embodiment of the invention.

In addition, the solar module 200 preferably includes fluid fittings 210 and tubing 212 to bring fresh coolant to the heat sink 204 and take heated coolant away to a fluid pumping and collection system 506, as shown in FIG. 8. Further, the solar module 200 preferably includes a mounting connector 208 to mount electrical cables 214. The electrical cables are used to transfer electricity from the photovoltaic cells 202 of adjacent solar modules 200 for use in the building. Preferably, the solar module 200 also includes attachment components affixed to the back support structure 206. The attachment components connect the solar module 200 to an actuating mechanism (discussed in more detail below) for tracking the sun. The number and type of attachment components may vary depending on which actuating mechanism is used. Attachment components may include a pivot connector 216, adapted to connect to a pivot pole 310 (FIGS. 6A, 6B) or a rod connector 218 adapted to attach to a rod 312. The attachment components may also include a hinges 220 attached the Fresnel lens 100.

Figure 3B:
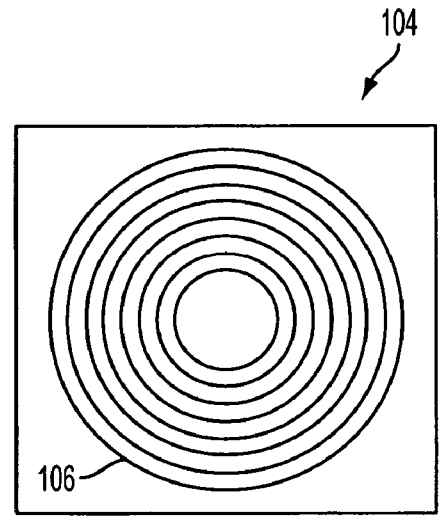
FIG. 3B is a Fresnel lens according to another embodiment of the invention.

In another embodiment of the invention shown in FIG. 3B, solar module 200 has a Fresnel lens 104 with a circular focal point or focusing portion 106. Fresnel lenses 104 with a circular focal point are commercially available and are preferably used with a photovoltaic cell 202 having a circular radiation receiving area. The Fresnel lens 104 with a circular focal point may also be used with a photovoltaic cell 202 having a polygonal radiation receiving area. However, the efficiency of a such solar module 200 will be somewhat lowered.

In a preferred embodiment of the present invention, each module 200 is made from a kit, where the parts are interlocked or snap fitted together. The kit preferably contains separate Fresnel lens 100, photovoltaic cell 202, heat sink 204 and back support structure 206. The lens 100 and the heat sink 204 are interlocked or snap fitted into the back support structure 206 for quick and inexpensive assembly or disassembly. The photovoltaic cell 202 may be attached to the heat sink 204 either permanently, such as by an adhesive or by bolts and/or brackets, or the photovoltaic cell 202 may be interlocked or snap fitted to the heat sink 204. Preferably, the photovoltaic cell 202 is mounted into a groove having the same shape as the cell 202 located in a front surface of the heat sink 204. The kit also contains a focusing lens 203 which is attached to the photovoltaic cell 202 and/or to the back support structure 206. The focusing lens may also be interlocked or snap fitted to the photovoltaic cell 202 and/or to the back support structure 206. If desired, a sealing material, such as an epoxy, may be used to seal portions of the module 200.

The module 200 may have any suitable dimensions depending on its desired end use size constraints. For example, the Fresnel lens 100 may have an area of 0.2 m$^2$ or less, such as 0.09 to 1.5 m$^2$. The lens 100 may have a square area having sides that are about 10-12 inches long. The back area of the back support structure 206 which is adapted to hold the heat sink 204 preferably comprises an area of 2 cm$^2$ or less, such as 0.5 to 1.5 cm$^2$. A length of the back support structure 206 from the front area adapted to hold the lens 100 to the back area is preferably 30 cm or less, such as 10 to 20 cm. The photovoltaic cell 202 radiation receiving area is preferably 1.5 cm$^2$ or less and has preferably has a polygonal shape, such as a square or rectangular shape.

Figure 4D:
FIG. 4D is a perspective view of a back diffusing surface of the back support structures of the modules.
Figure 4F:
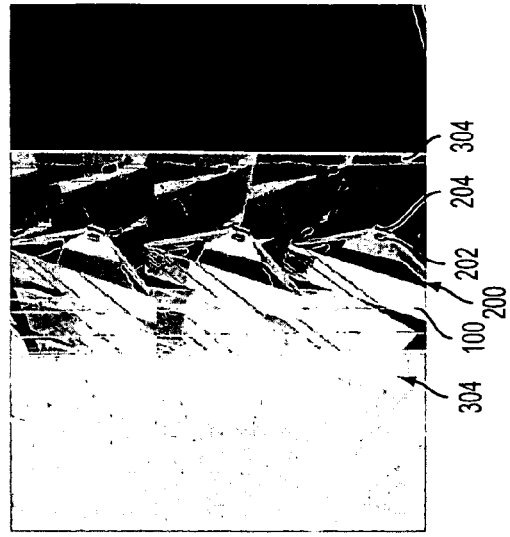
FIG. 4F is a side cross sectional view of FIG. 4E.
Figure 4C:
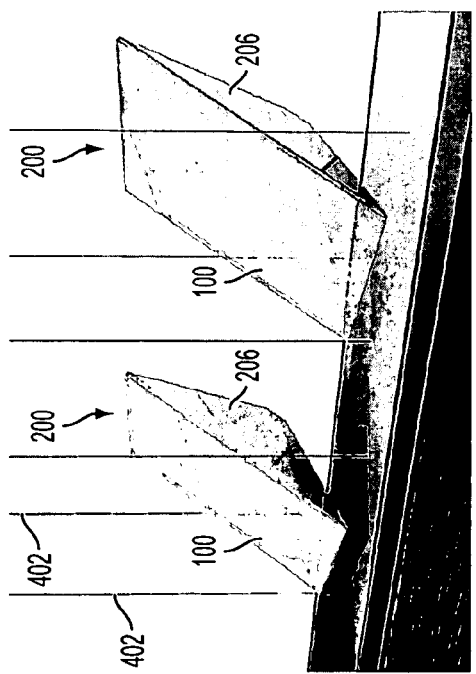
FIG. 4C is a perspective view of a front Fresnel lens surface of the solar modules.
Figure 4E:
FIG. 4E is a perspective view of modules in a double skin facade.

FIGS. 4C-4F illustrate details of the modules 200. FIG. 4C illustrates the Fresnel lens 100 surface of the modules 200. FIG. 4D illustrates a back view of the modules 200 showing the diffusing surface of the back support structures (i.e., encasements) 206. FIG. 4E illustrates a plurality of modules 200 in a double skin facade suspended by wires 402 between two layers 304 of glass or other transparent material. FIG. 4F is a side cross sectional view of FIG. 4E.

FIGS. 6A-6D illustrate another embodiment of the invention. This embodiment is a solar panel 300 which comprises a plurality of solar modules 200 and a first actuating mechanism 302 for tracking the sun. The solar panel 300 includes a glazed building envelope system. That is, it comprises two layers of transparent glass 304 separated by an air gap 306.

Inside the air gap 306 is a solar energy capture system 308 which includes a plurality of solar modules 200 arranged in a column. The plurality of solar modules 200 are affixed to a pivot pole 310 which allows the module to rotate about the longitudinal axis as the pivot pole 310 is rotated. In addition, adjacent solar modules 200 in a column are connected by at least one connector rod 312. At one end of the column and perpendicular to it, is a cross pole 314. The connector rod 312 is attached to the cross pole 314. By rotating the cross pole 314, the connector rod 312 is moved up or down, causing the solar module 200 to pivot perpendicularly to the longitudinal axis. In this manner, two-axis motion is achieved and the solar module 200 can be made to track the sun throughout the day.

In one aspect of this embodiment, the solar panel 300 includes a plurality of pivot poles 310, each including a plurality of solar modules 200. To rotate the pivot poles, the solar panel 300 includes a first motor 316 and a first gearbox 318 connected to one pivot pole 310. The solar panel 300 also includes a first drive arrangement 328 which includes a pulley 320 provided at one end of each pivot pole 310 and at least one drive belt 322 connecting the pulleys 320. Parallel columns of solar modules 200 can thus be rotated synchronously by rotating one pivot pole 310.

In this aspect of the invention, each adjacent solar module 200 in a column of the solar panel 300 is connected by at least one connector rod 312. By using a second drive arrangement 330, the solar modules 200 within a column may be pivoted in a direction perpendicular (orthogonal) to rotational axis of the pivot poles 310. In this aspect of the invention, the second drive arrangement 330 includes a cross pole 314 perpendicular to the plurality pivot of poles 310 and a cross connector 332. Attached to the cross pole 314 is a second motor 324 and a second gearbox 326.

Figure 7:
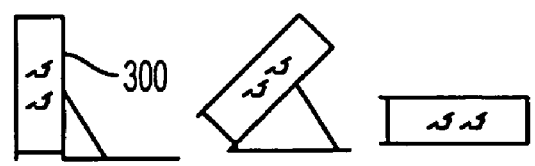
FIG. 7 is a schematic view illustrating various mounting capabilities of an embodiment of the invention.

The solar energy capture system 308 doubles as a solar shading and heat gain reduction system for commercial buildings. The system consists of multiple solar modules 200 in rows and columns all acting in unison. The orientation of the solar panels 300 on a building can be vertical, horizontal, or at any angle in between these two limits; the panels can be mounted on a wall, roof, or atrium (see FIG. 7). This captured solar energy reduces the solar gain by the building, providing a savings in air conditioning.

FIG. 8 illustrates a solar energy system according to one embodiment of the invention. In this embodiment, three solar panels 300, each one story high, are affixed to the facade of a building 500. The PV cells 202 on the modules convert between 15-50% of the captured energy to DC electricity. Additional energy is captured as thermal energy that is gathered by the heat sink 204 on which the PV cell 202 is mounted. A coolant (e.g., water) passes through the heat sink 204, and the thermal energy entering the heat sink 204 is transferred to the water. However, other heat sinks described above may also be used instead or in addition. Returning to FIG. 8, the DC electrical energy may be transferred to an electrical energy extraction mechanism 502 which may include either DC and/or AC power applications. Example applications include a LED lighting system or the electrical grid of the building. Preferably, the LED lighting system is automatically adjusted with sensors to the ambient daylighting in the building. The hot coolant (at an appropriate temperature) may be pumped to a thermal energy extraction mechanism 504. The thermal energy extraction mechanism 504 may comprise a fluid pumping and collection system 506 and a heat exchanger 508. The extracted thermal energy may be used to drive a thermal building system. Example thermal building systems include domestic hot water, space heating and absorption refrigeration cooling.

Because of the design and location of the modules 200, diffuse daylight is admitted to the interior of a building through the spaces between modules 200 in a panel 300 and some through the modules 200 themselves. In other words, since the modules 200 rotate to directly face the sun, they block out the harshest sun rays and the heat generated while allowing the most pleasing daylight to be transmitted to the interior of the building envelope. The translucent, diffusing and/or Fresnel scattering surface of the back support structure 206 of the modules assists in blocking out the harsh, direct sun rays while providing pleasing diffuse sunlight or daylight to the interior of the building envelope. FIGS. 9A-9D illustrate the rotation of the modules 200 throughout the day as they follow the path of the sun from morning to late afternoon. As shown in these Figures, the Fresnel lenses of the modules are positioned perpendicular to the sunlight rays.

If desired, photosensors may be attached to and/or embedded in the modules 200 and/or embedded in the walls, roof and/or windows of the building to ensure that the modules are facing the sun to capture all of the incoming sunlight while diffusing harsh, unwanted rays to prevent a portion of the such rays from reaching the interior of the building. The movement of the modules 200 by the actuating mechanism in the solar panel 300 is synchronized with the sun's position detected by the photosensors by a computer or other data processing device.

Alternatively, the photosensors may be omitted and the movement of the modules 200 may be based on stored or transmitted movement data. For example, once the location (such as latitude, longitude and compass orientation) of the solar panel 300 is determined, this data may be used in conjunction with clock and calendar data to determine the position of the sun relative to the solar panel at any given time. The modules 200 are then moved to follow the sun based on this data. For example, the sun's position at any given time on any given day at a particular latitude and longitude is known. The orientation of the installed panel 300 is also known. This data is then used to calculate the desired position of the modules at any given time and to control the movement of the modules 200 throughout any given day. The movement data may be stored in a computer or other similar module 200 movement control device or transmitted electronically or wirelessly from a central controller to the module movement actuator.

In addition, substantially unobstructed or partially unobstructed views of the outside are available by looking past the spaced apart modules 200, as shown in FIGS. 9A-9D. In other words, objects may be viewed through spaces between the plurality of modules 200.

Figure 10A:
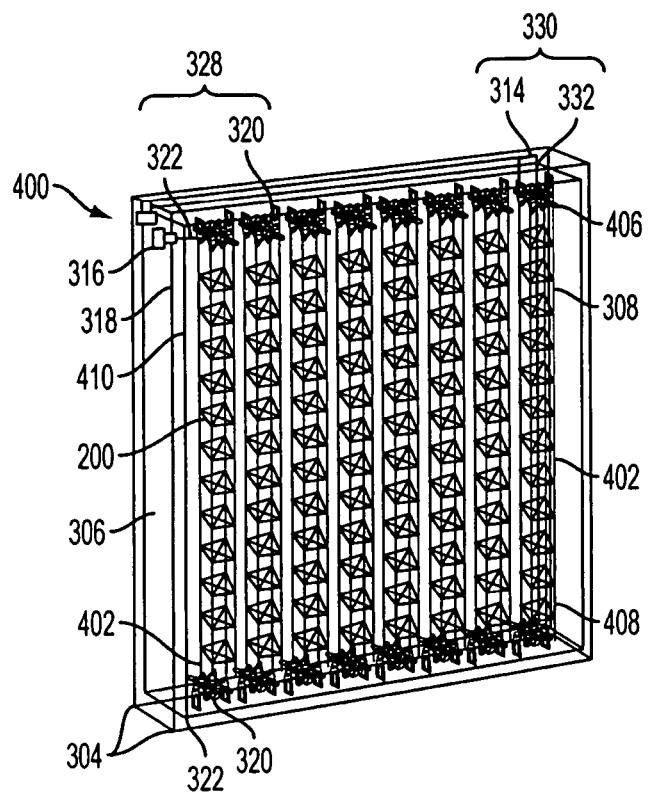
FIG. 10A is a perspective view of a solar panel according to one embodiment of the invention.
Figure 10B:
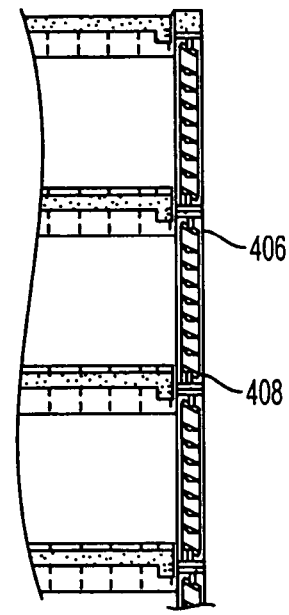
FIG. 10B is a schematic side view of the solar panel illustrated in FIG. 10A.
Figure 10C:
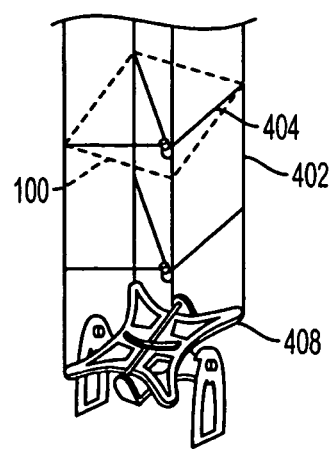
FIG. 10C is a close up of a portion of the solar panel illustrated in FIG. 10A.

FIGS. 10A-10C illustrate another embodiment of the invention. This embodiment is a solar panel 400 which comprises a plurality of solar modules 200 and a second actuating mechanism 402 for tracking the sun. As in the previous embodiment of the invention, the solar panel 400 includes a glazed building envelope system. That is, it comprises two layers of transparent glass 304 separated by an air gap 306.

In this embodiment, the solar panel 400 includes a solar energy capture system 308 which includes at least one column of solar modules 200. Unlike the previous embodiment, the solar modules 200 are not mounted on pivot poles 312. In this embodiment, the marionette scheme, adjacent solar modules 200 in the column are connected by wires or rods 402 attached to hinges 404 on the Fresnel lenses 100. At the top of the column is a first actuating frame 406 while a second actuating frame 408 is attached to the bottom of the column.

Similar to the rotation of the pivot poles 310 in the previous embodiment, the first and second actuating frames 406, 408 can be rotated about the longitudinal axis. Because all of the solar modules 200 in the column are connected by the wires or rods 402, all of the solar modules 200 in the column rotate together. Additionally, as in the previous embodiment, the present embodiment includes a cross pole 314 perpendicular to the column of solar modules 200. Typically, the cross pole is connected to the first actuating frame 406. By rotating the cross pole 314, the first actuating frame 406 is pivoted, causing the solar modules 200 to pivot perpendicularly to the longitudinal axis. In this manner, two-axis motion is achieved and the solar modules 200 can be made to track the sun throughout the day.

In one aspect of the invention, the solar panel 400 includes a plurality of columns of solar modules 200. To rotate the columns, the solar panel 400 includes a first motor 316 and a first gearbox 318 connected to one of the first actuating frames 406. Also included is a first drive arrangement 328 which includes (1) a drive pole 410 parallel to the columns of solar modules 200 and located at one end of the solar panel 400, (2) at least one pulley 320 affixed to the first actuating frames 406 of each column of solar modules 200 and (3) at least one drive belt 322 connecting the pulleys. In a preferred aspect of this embodiment, at least one pulley 320 is also affixed to the second actuating frames 408 of each column of solar modules 200 and connected by at least one other drive belt 322. By use of the first drive arrangement 328, parallel columns of solar modules 200 can be rotated synchronously.

The solar panel 400 also includes a second drive arrangement 330 to pivot the solar modules 200 in a direction perpendicular to the axis of rotation of the column. The second drive arrangement 330 includes a cross pole 314 perpendicular to the columns of solar modules 200 and cross connector 332 connecting the cross pole 314 to the first actuating frames 406. By rotating the cross pole 314, the first actuating frame 406 is pivoted, causing the solar modules 200 to pivot perpendicularly to the axis of rotation of the column.

Figure 11A:
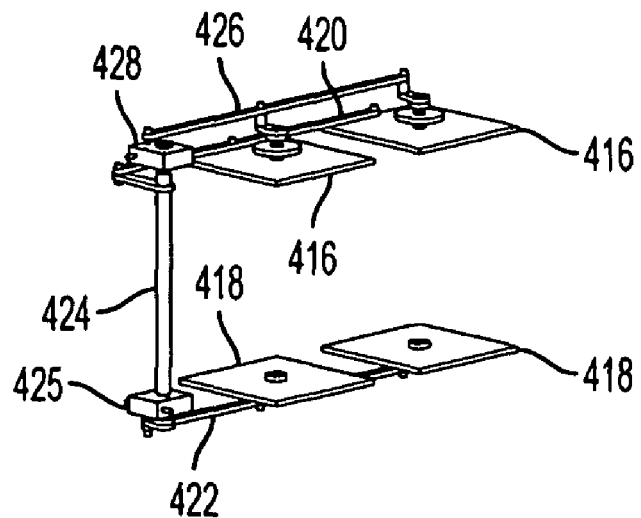
FIG. 11A is a perspective view and FIG. 11B is a side view of a draglink actuating assembly according to another embodiment of the present invention.
Figure 11B:
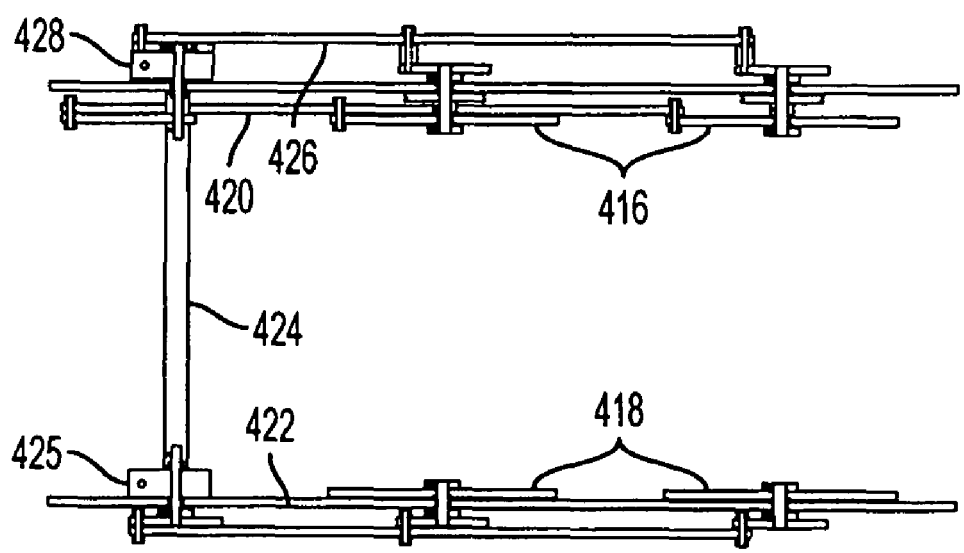

FIG. 11A illustrates a perspective view and FIG. 11B illustrated a side view of a draglink actuating assembly 412 for the modules 200 according to another embodiment of the present invention. The draglink actuating assembly 412 is also adapted to rotate the modules 200 around two axes, but in a somewhat different manner than the marionette scheme illustrated in FIGS. 10A-10C. In the draglink actuating assembly 412, the modules 200 are suspended by wires or rods 402 from upper 416 and lower 418 movable frames. Preferably, the frames 416 and 418 are plate shaped. However, other suitable shapes may also be used. The upper frames 416 are connected together by an upper horizontal rod 420. The lower frames 418 are connected together by a lower horizontal rod 422. A vertical connecting rod 424 operatively connects the rods 420 and 422 together. A first gear box 425 powered by a first motor (not shown) or other actuator turns rod 424 about its axis, causing rods 420 and 422 to move together in a horizontal direction (i.e., to the left or to the right in FIG. 11B). This causes the frames 416 and 418 to rotate together about a vertical axis, thus turning the modules 200 about a first (i.e., vertical) axis of rotation. Furthermore, at least one of the frames 416 and 418, such as the upper frames 416, are also operatively connected to an actuating rod 426 which is connected to a second gear box 428 powered by a second motor (not shown) or other actuator. Movement of rod 426 causes the frames 416 to turn about a horizontal axis, which in turn turns the modules 200 about a second axis of rotation. Thus, in the draglink system 412, the upper frames 416 are attached to each other and rotate together about two axes of rotation due to rotation of two different rods. While the system 412 was described as having frames being moved by rods, such as bar shaped or cylinder shaped rods, the frames may be moved by wires or other shaped connectors instead. If cooling fluid heat sinks 204 are used, then substantially transparent cooling fluid tubes may be attached to the horizontal rods 420 and 422.

Figure 11C:
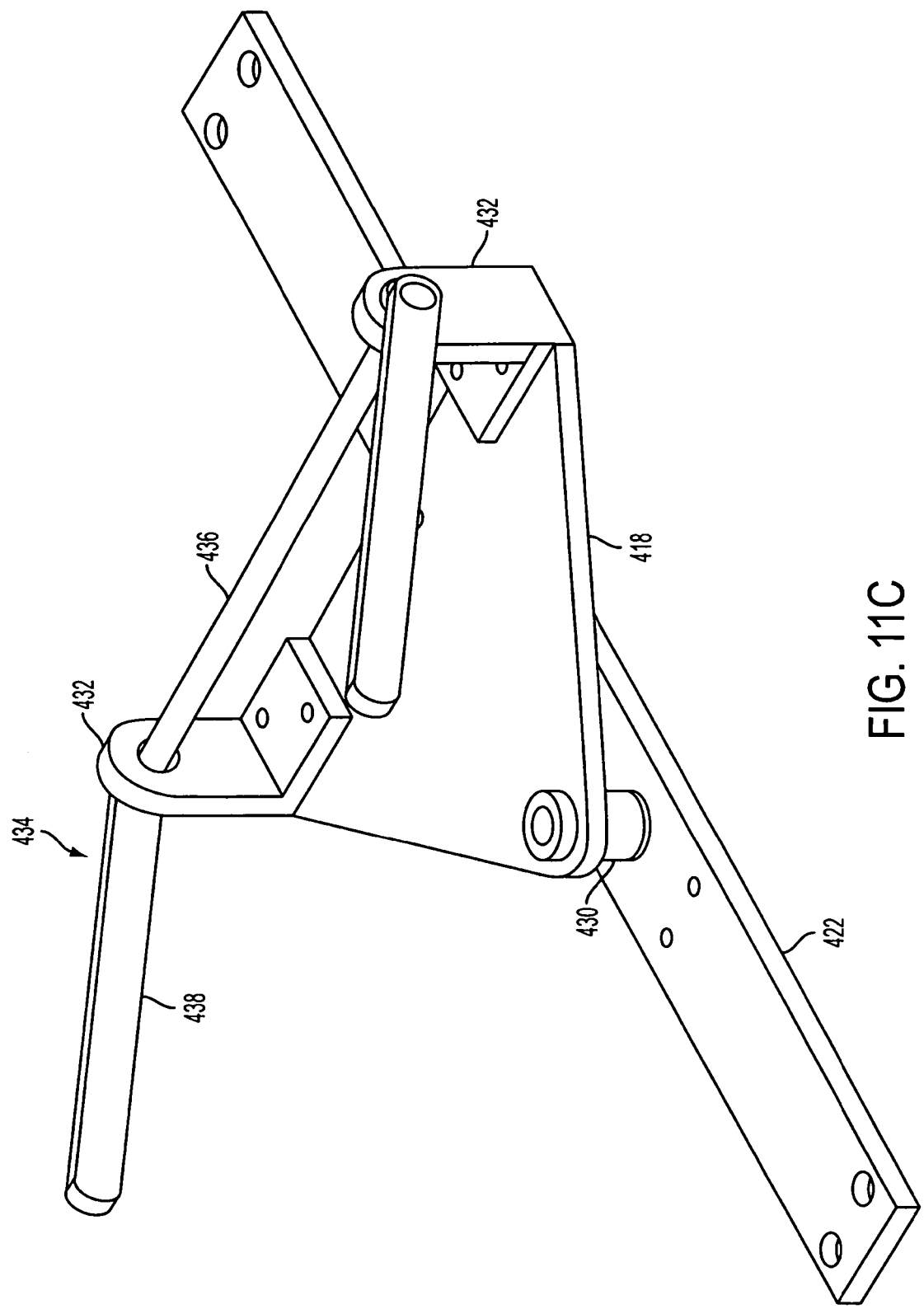
FIGS. 11C and 11D are close up perspective views of parts of the lower and upper portions, respectively, of the draglink actuating assembly illustrated in FIGS. 11A and 11B.
Figure 11D:
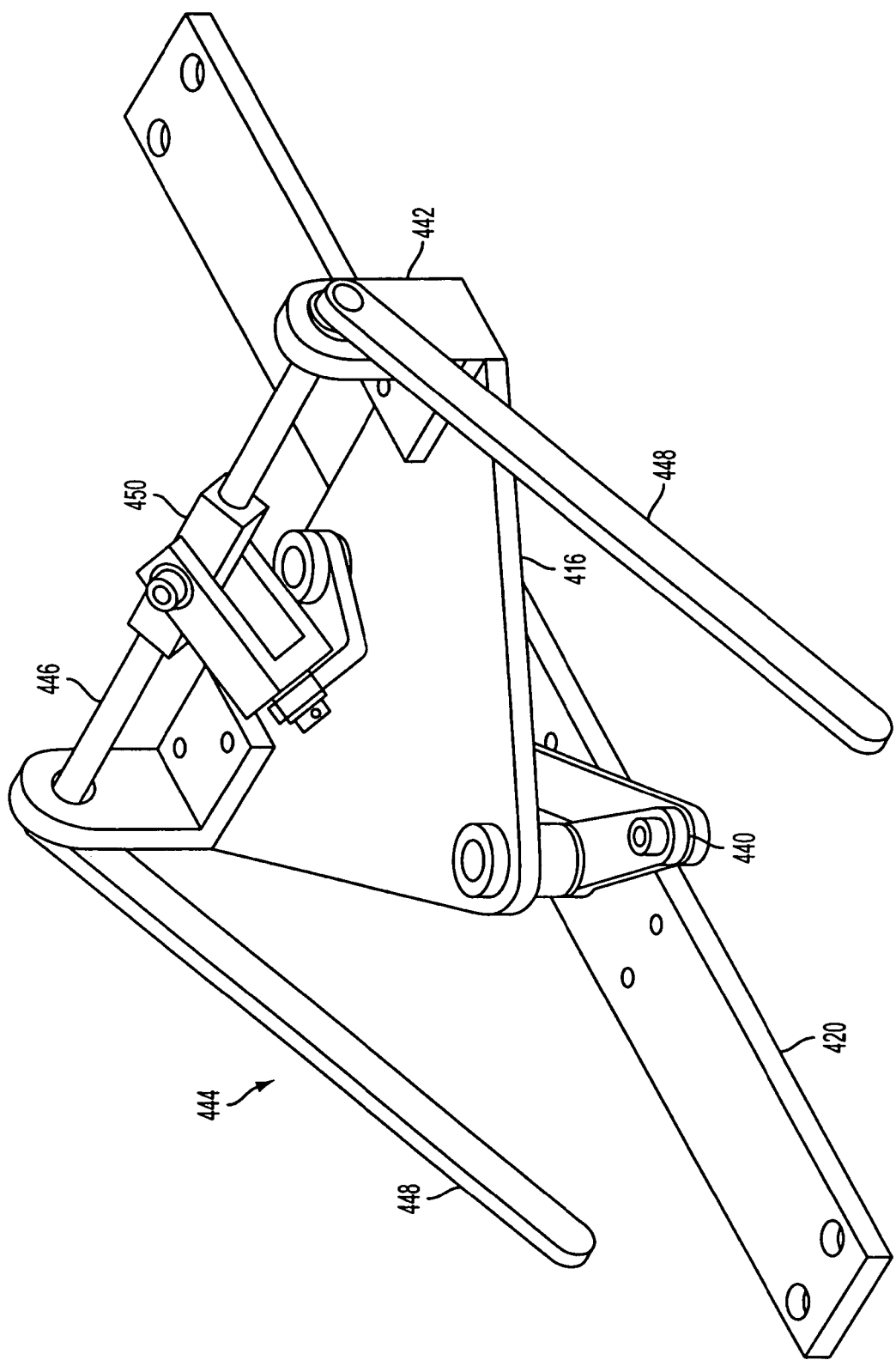

FIGS. 11C and 11D are close up perspective views of parts of the lower and upper portions, respectively, of the draglink actuating assembly 412 illustrated in FIGS. 11A and 11B. FIG. 11C illustrates one lower frame 418 rotatably attached to the lower horizontal rod 422 by a rod or clamp 430. For example, the frame 418 may be attached to a short, cylindrical, vertically oriented rod 430 in such a manner that frame 418 can rotate about the vertical axis of the rod 430. L-shaped brackets 432 are attached to the upper surface of the frame 418. A U-shaped connector 434 is rotatably attached between the brackets 432. The connector 434 rotates about the horizontal axis of its horizontal portion 436 located between the brackets. The non-horizontal portions 438 of connector 434 are connected to wires or rods (not shown) which support the modules 200 (not shown).

FIG. 11D illustrates one upper frame 416 rotatably attached to the upper horizontal rod 420 by a rotatable elbow 440. The elbow 440 allows the frame 416 to be rotated about a vertical axis by the rod 420. L-shaped brackets 442 are attached to the upper surface of the frame 416. A first U-shaped connector 444 is rotatably attached between the brackets 442. The connector 444 rotates about the horizontal axis of its horizontal portion 446 located between the brackets. The non-horizontal portions 448 of connector 444 are connected to wires or rods (not shown) which support the modules 200 (not shown) located below the frame 416. A second connector 450 connects the actuating rod 426 (shown in FIGS. 11A and 11B) to the horizontal portion 446 of the first connector 444 and to the upper frame 416. The second connector 450 provides movement of the upper frame 416 around its second axis of rotation.

Figure 12:
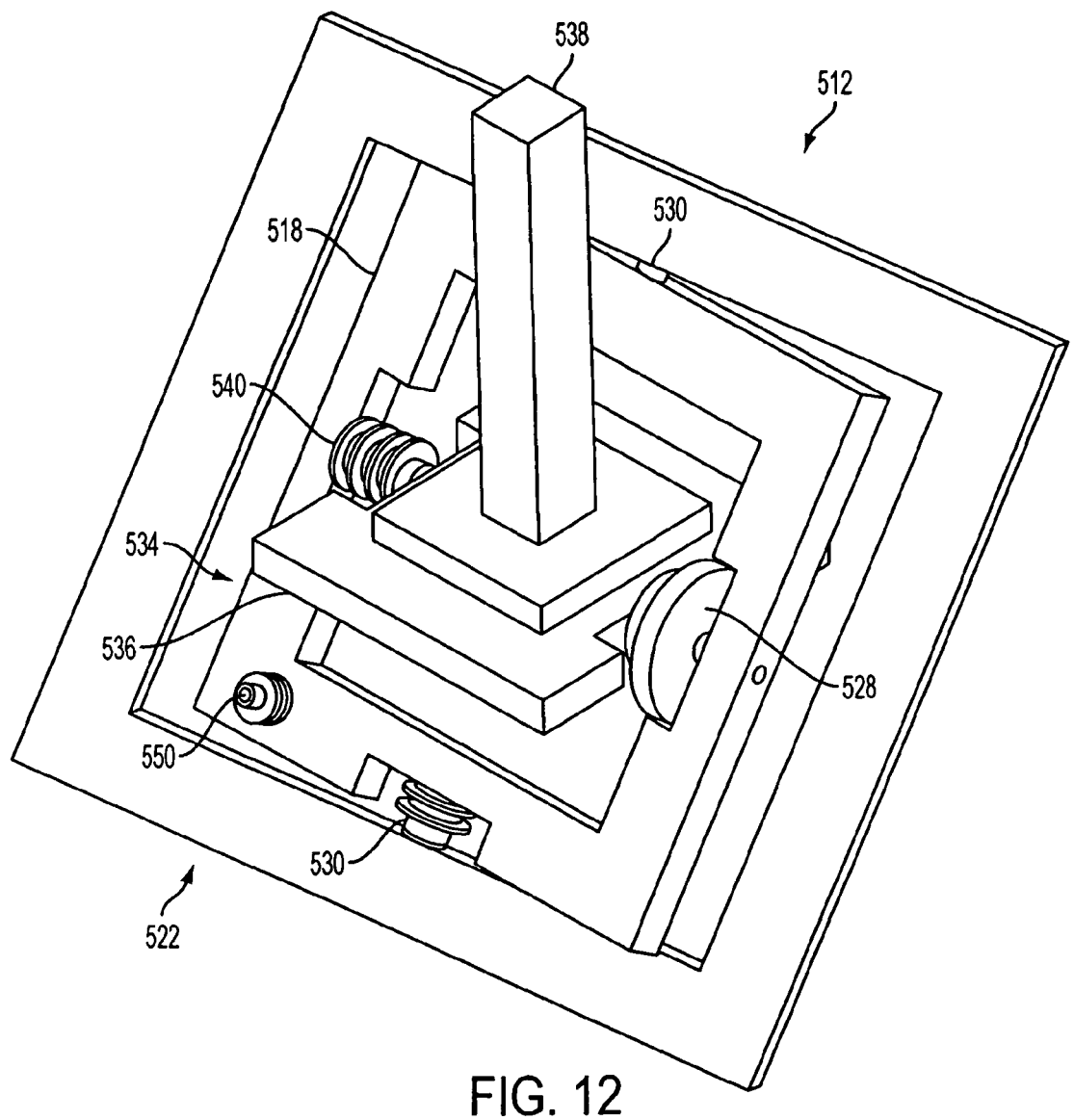
FIGS. 12 and 13 are perspective views of MRT and MAE actuating assemblies according to an embodiment of the invention.

FIG. 12 illustrates a perspective view of a marionette roll tilt (MRT) actuating assembly 512 for the modules 200 according to another embodiment of the present invention. The MRT assembly 512 is also adapted to rotate the modules 200 around two axes, but in a somewhat different manner than the marionette scheme illustrated in FIGS. 10A-10C. The MRT assembly 512 contains an inner frame 518 and an outer frame 522. The frames 518 and 522 may have any suitable shapes. For example, the frames 518 and 522 are square or rectangular hollow frames as shown in FIG. 12. However, the frames may be circular or have other hollow shapes as desired. Furthermore, the frames do not necessarily have to have enclosed hollow shapes (i.e., square or circle) and may have open shapes, such as semi-circle or half-square, for example. The inner frame 518 is preferably located inside the outer frame 522. Preferably, the outer frame remains stationary and the inner frame rotates about a first axis of rotation relative to the outer frame. The inner frame 518 may be rotatably mounted to the outer frame 522 by one or more rods, clamps or shafts 530.

The MRT assembly 512 also contains a connector 534. The connector 534 contains a base portion 536 and an extendible portion or arm 538 connected to the base portion. The base portion 536 is rotabably connected to the inner frame 518, such that the base portion can rotate about a second axis of rotation compared to the inner frame. The second axis of rotation is preferably perpendicular to the first axis of rotation of the inner frame. The base portion 536 may be rotatably mounted to the inner frame 518 by one or more rods, clamps or shafts 540. The extendible portion 538 of the connector may have any suitable shape, such as a rod shape, such that it can extend away from the frames 518 and 522. The extendible portion 538 of the connector 534 is connected to wires or rods (now shown) which support the modules 200 (not shown).

If desired, a motor or actuator powered gear box 528 may be mounted on the second axis of rotation to rotate the connector 534 relative to the inner frame 518 around the second axis of rotation. The same or different motor or actuator (not shown) may be used to rotate the inner frame 518 around the first axis of rotation, such that the wires or rods connecting the connector 534 to the modules 200 move the modules along two axes of rotation. The inner frame 518 may be rotated by attaching a wire or rod from the motor or actuator to a connection point 550. It should be noted that separate MRT assemblies 512 may be used to support and move the modules 200 from above and from below. Thus, the inner frame 518 and the extendible portion 538 of the connector 534 can move together to provide two axis motion for the modules 200.

Figure 13:
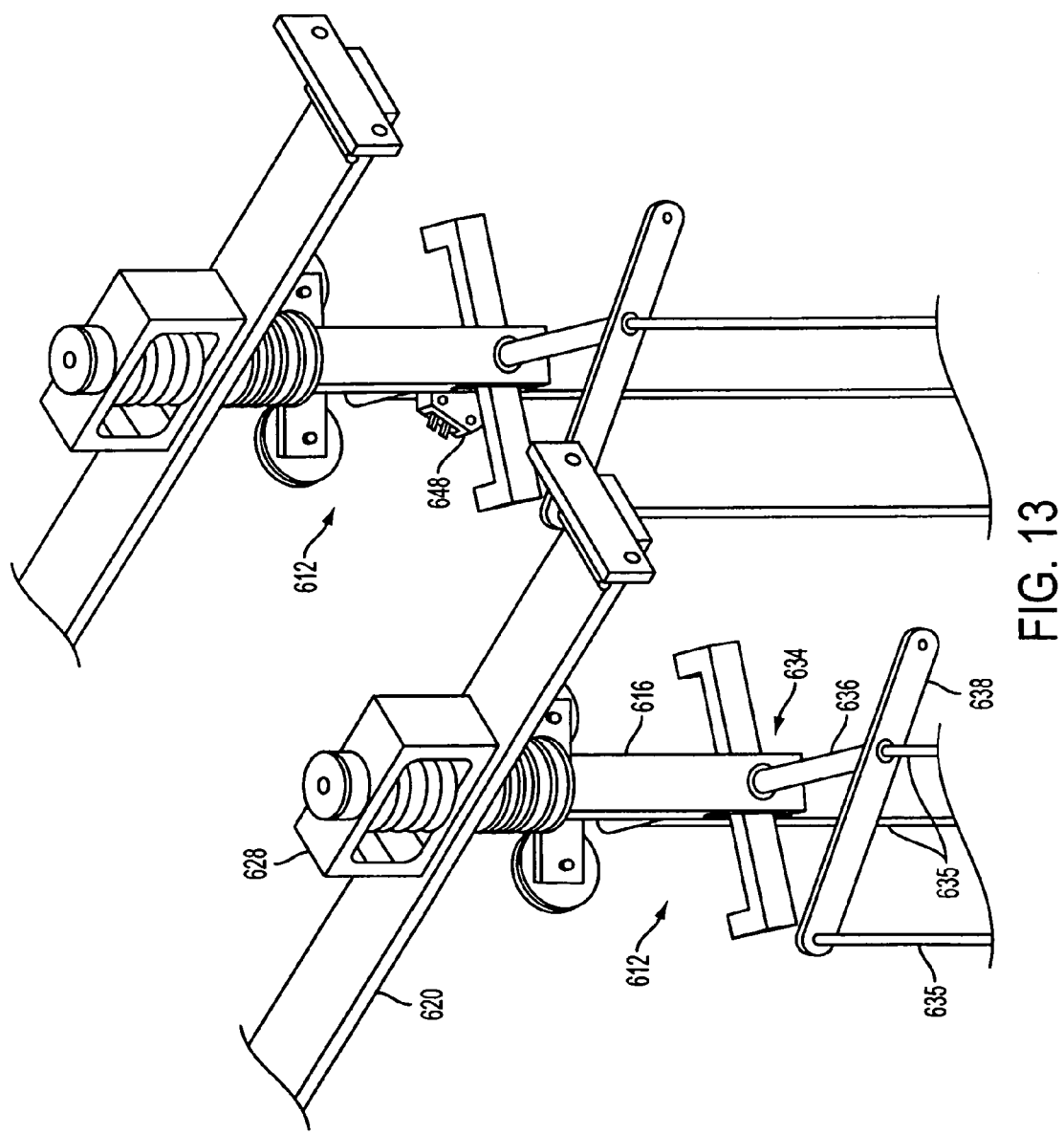

FIG. 13 illustrates a perspective view of a marionette azimuth elevation (MAE) actuating assembly 612 for the modules 200 according to another embodiment of the present invention. The MAE assembly 612 is also adapted to rotate the modules 200 around two axes, but in a somewhat different manner than the marionette schemes illustrated in FIGS. 10A-10C and 12. The upper MAE assemblies 612 shown in FIG. 13 are mounted on upper horizontal rods 620. The MAE assembly 612 contains a vertical shaft or rod 616 that is mounted below the upper horizontal rod 620. A gear box 628 turns the vertical shaft or rod 616 about a vertical axis to rotate the modules 200 in a horizontal plane. The MAE assembly 612 also contains a connector 634 which supports the wires or rods 635 which support and turn the modules 200 (not shown). The connector 634 may be "X", "T" or "U" shaped or a combination thereof. The connector 634 is adapted to move the wires or rods 635 in the vertical direction to achieve two axis movement of the modules 200. For example, in a "T" shaped connector, a second gear box 648 rotates the horizontal rod 636 about its horizontal axis to lift and lower an arm or extendible portion 638 mounted on the rod 636. A wire or rod 635 mounted to an end portion of the arm 638 moves up and down with the arm 638 as the rod 636 rotates. The vertical shaft 616 and arm 638 can move together to provide two axis motion for the modules 200.

The preferred solar panel embodiments 300, 400 include two axis actuating systems, with modules 200 which are preferably inclined according to the latitude of the building site. However, the present invention also include embodiments having solar modules 200 affixed to single axis actuating systems.

Figure 14:
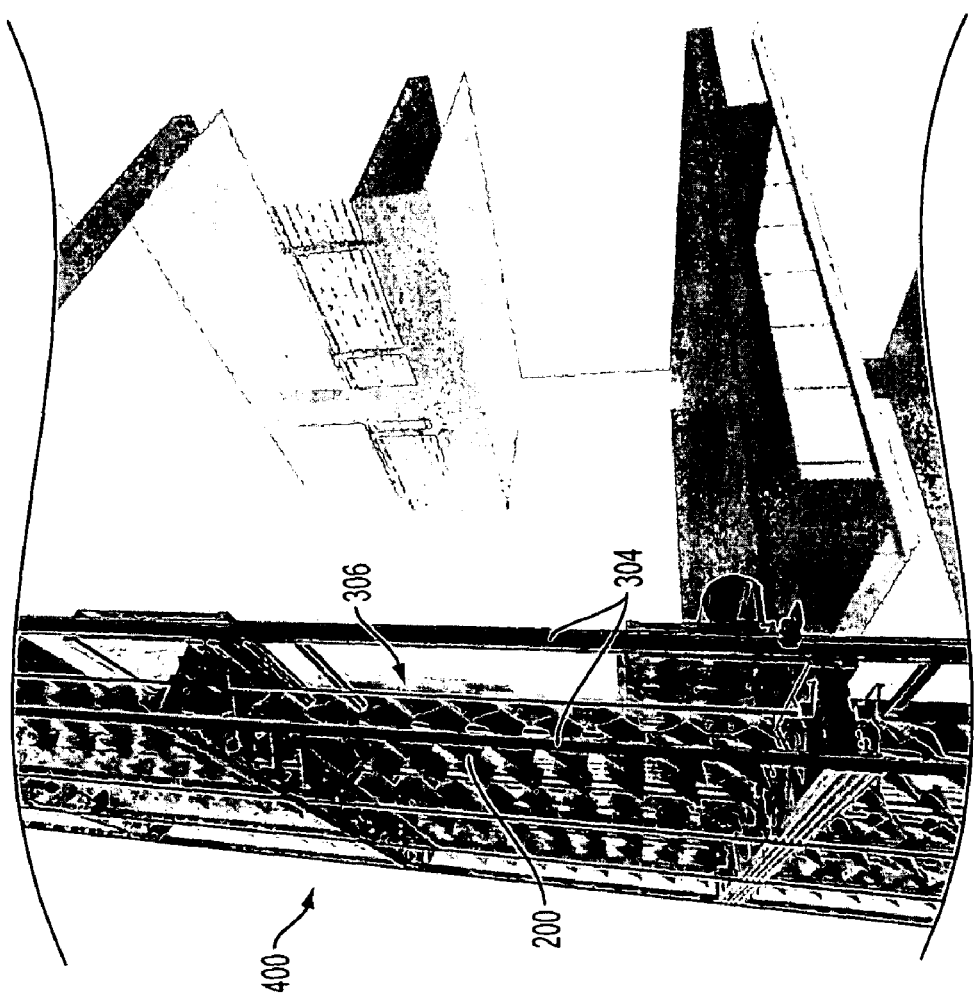
FIG. 14 is a perspective view of a solar panel located vertically in a facade of a building envelope, according to another embodiment of the invention.

Preferably, the solar panel 400 is located in a facade of the building envelope. For example, as shown in FIG. 14, the panel 400 is located in a gap 306 between two windows 304 in a building facade. The panel 400 is not limited to a single floor in height and may extend in the facade in front multiple building floors, as exemplified in FIG. 14.

Figure 15:
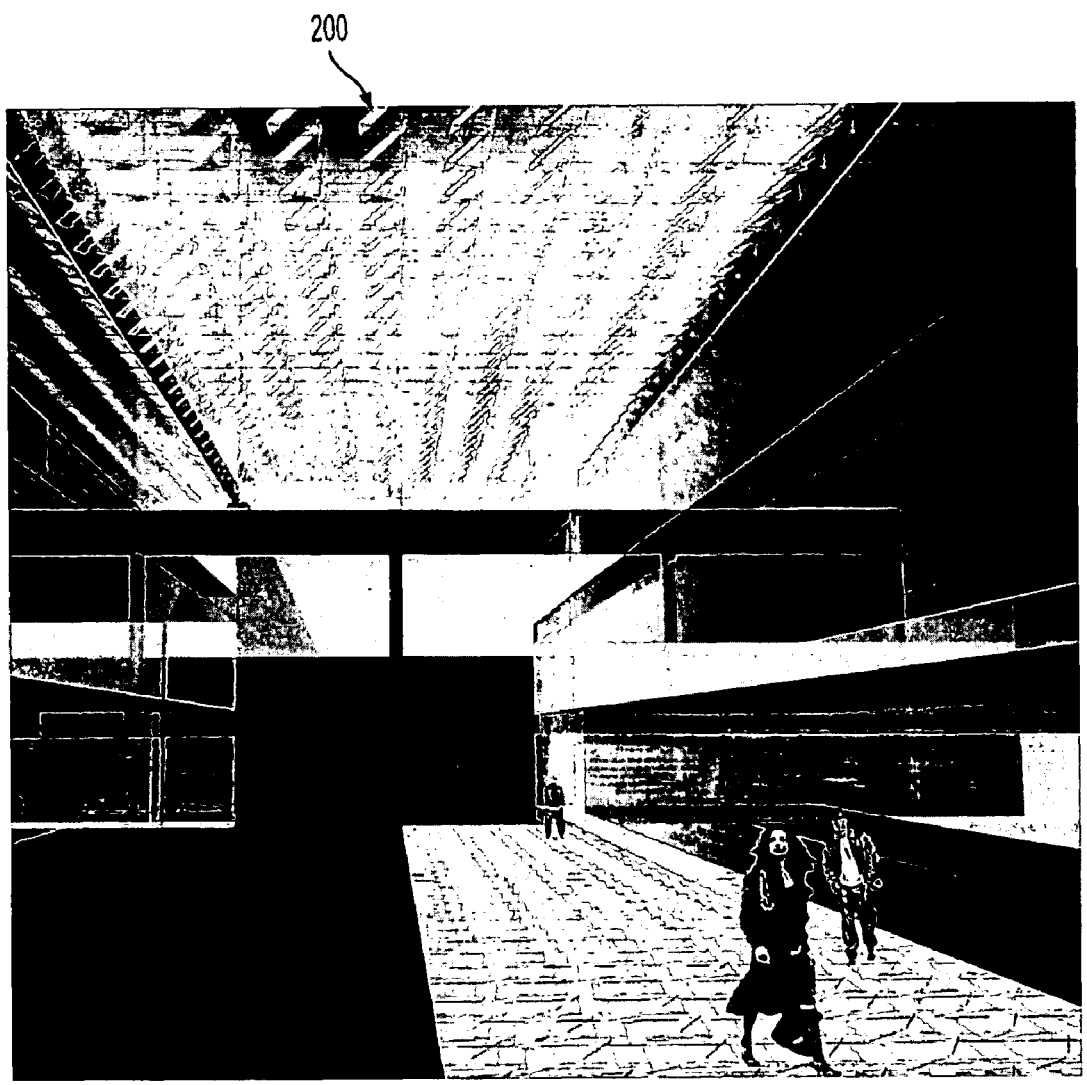
FIG. 15 is a perspective view of a solar panel located horizontally over a building atrium, according to another embodiment of the invention.

It should be noted that the solar panels 300, 400 may be used in locations other than windows of buildings. The solar panels may be located horizontally, such as on roofs of buildings, or as shown in FIG. 15, incorporated into horizontal building envelope portions, such as transparent atrium ceilings and other similar ceiling structures. The solar modules 200 may also be mounted on vehicles, such as automobiles, trucks, planes, boats and space vehicles.

Furthermore, while the previous embodiments illustrated modules 200 having individual diffusing surfaces 206 located behind the photovoltaic cells 202, one large shielding plate may be used for several modules instead. Thus, individual modules 200 may have wire 207 back support structures 206 shown in FIG. 4B and a large shielding plate may be provided between the modules 200 and the human observer. The shielding plate may comprise a light diffusing or a light blocking material. The shielding plate may have any suitable size, and may be sized to cover a 2×4 array of modules 200 for example. The modules 200 may be suspended separately from the shielding plate or the modules may be attached to the shielding plate, such that the plate remains stationary or moves with the modules 200, respectively, when the modules are rotated.

The foregoing description of the invention has been presented for purposes of illustration and description. It is not intended to be exhaustive or to limit the invention to the precise form disclosed, and modifications and variations are possible in light of the above teachings or may be acquired from practice of the invention. The drawings and description were chosen in order to explain the principles of the embodiments of the invention and its practical application. It is intended that the claims and terms thereof be interpreted to protect the invention to the broadest extent permitted by the prior art and the applicable law.

What is claimed is:

1. A structure, comprising:
   a glazed building envelope;
   a plurality of spaced apart solar modules located in a space between two transparent glass layers in the glazed building envelope; and
   an actuating mechanism operatively connected to the plurality of solar modules and adapted to move the solar modules in two dimensions about two axes track the sun;
   wherein each module comprises a back support structure, a photovoltaic cell, a heat sink on which the photovoltaic cell is mounted, and a concentrating device which is adapted to concentrate solar radiation onto the photovoltaic cell;
   the back support structure comprises a translucent material, a Fresnel diverging material or a diffusing material such that diffuse light is admitted into the glazed building envelope through each module;
   the back support structure connects the concentrating device and the heat sink in a fixed geometry; and
   wherein the plurality of solar modules are spaced apart from each other such that partially or substantially unobstructed views of objects are available through spaces between the plurality of solar modules and through the two transparent glass layers.

2. The structure of claim 1, wherein the actuating mechanism is adapted to move the solar modules in two dimensions about two axes to track the sun such that the concentrating device is positioned perpendicular to sunlight rays throughout a day.

3. The structure of claim 2, wherein the glazed building envelope comprises a portion of a building facade envelope or a transparent atrium ceiling of a multistory building.

4. The structure of claim 2, wherein:
   the concentrating device comprises a collecting lens which has a substantial portion adapted to concentrate solar radiation to a specified area and shape; and
   the photovoltaic cell is mounted at distance from the collecting lens such that the active area of the photovoltaic cell is irradiated by the light collected and concentrated by the collecting lens.

5. The structure of claim 4, wherein each solar module further comprises:
   a concentrating lens located between the collecting lens and the photovoltaic cell; and
   the back support structure connecting the collecting lens and the heat sink in a fixed geometry.

6. The structure of claim 1, wherein:
   each solar module has a substantially pyramidal or a substantially conical shape where the concentrating device forms a base of the shape and the back support structure forms at least one wall of the shape.

7. The structure of claim 6, wherein the heat sink includes a cooling scheme which comprises at least one channel adapted to carry cooling liquid.

8. The structure of claim 2, further comprising connecting devices which connect the actuating mechanism to the plurality of modules.

9. The structure of claim 1, wherein each module has a cross sectional area that is less than 0.2 m$^2$.

10. The structure of claim 1, wherein the two transparent glass layers comprise a building window or a transparent atrium ceiling.

11. The structure of claim 1, wherein the back support structure comprises the translucent material.

12. The structure of claim 1, wherein the back support structure comprises the Fresnel diverging material.

13. The structure of claim 1, wherein the back support structure comprises the diffusing material.

14. A structure, comprising:
   a glazed building envelope;
   a plurality of spaced apart solar modules located in a space between two transparent glass layers in the glazed building envelope, wherein each module comprises a back support structure, a photovoltaic cell, a heat sink on which the photovoltaic cell is mounted, and a concentrating device which is adapted to concentrate solar radiation onto the photovoltaic cell; and
   an actuating mechanism operatively connected to the plurality of solar modules and adapted to move the solar modules in two dimensions about two axes to track the sun such that the concentrating device is positioned perpendicular to sunlight rays throughout a day;
   wherein the back support structure comprises a translucent material, a Fresnel diverging material or a diffusing material such that diffuse light is admitted into the glazed building envelope through each module;
   the back support structure connects the concentrating device and the heat sink in a fixed geometry; and
   wherein the plurality of solar modules are spaced apart from each other such that partially or substantially unobstructed views of the outside are available by looking past the spaced apart solar modules through the two transparent glass layers from inside the glazed building envelope.

15. The structure of claim 14, wherein:
   each solar module has a substantially pyramidal or a substantially conical shape where the concentrating device forms a base of the shape and the back support structure forms at least one wall of the shape.

16. The structure of claim 14, wherein:
   the two transparent glass layers comprise a building window or a transparent atrium ceiling.

17. The structure of claim 14, wherein the heat sink comprises at least one cooling liquid carrying channel.

18. A structure, comprising:
a glazed building envelope;
a plurality of spaced apart solar modules located in a space between two transparent glass layers in the glazed building envelope, wherein each module comprises a back support structure, a photovoltaic cell and a concentrating device which is adapted to concentrate solar radiation onto the photovoltaic cell; and
an actuating mechanism operatively connected to the plurality of solar modules and adapted to move the solar modules in at least a single dimension to track the sun such that the concentrating device is positioned perpendicular to sunlight rays throughout a day;
wherein:
the back support structure comprises a translucent material, a Fresnel diverging material or a diffusing material such that diffuse light is admitted into the glazed building envelope through each module; and
each solar module has a substantially pyramidal or a substantially conical shape where the concentrating device forms a base of the shape and the back support structure forms at least one wall of the shape.

19. The structure of claim 18,
wherein the plurality of modules are spaced apart from each other such that objects may be viewed through spaces between the plurality of modules.

20. The structure of claim 18, wherein:
the two transparent glass layers comprise a building window or a transparent atrium ceiling; and
the actuating mechanism is adapted to move the solar modules in two dimensions about two axes to track the sun.

21. The structure of claim 18, wherein each module further comprises a heat sink which comprises at least one cooling liquid carrying channel.

22. The structure of claim 18, wherein the back support structure comprises the translucent material.

23. The structure of claim 18, wherein the back support structure comprises the Fresnel diverging material.

24. The structure of claim 18, wherein the back support structure comprises the diffusing material.

* * * * *